(12) United States Patent
Yeh

(10) Patent No.: US 12,550,287 B2
(45) Date of Patent: Feb. 10, 2026

(54) FAN MODULE AND ELECTRONIC DEVICE

(71) Applicant: Nanning FuLian FuGui Precision Industrial Co., Ltd., Nanning (CN)

(72) Inventor: Chih-Yu Yeh, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 372 days.

(21) Appl. No.: 18/201,305

(22) Filed: May 24, 2023

(65) Prior Publication Data
US 2024/0397661 A1  Nov. 28, 2024

(51) Int. Cl.
*H05K 7/20* (2006.01)
*F16K 15/02* (2006.01)

(52) U.S. Cl.
CPC ..... *H05K 7/20145* (2013.01); *H05K 7/20172* (2013.01); *F16K 15/026* (2013.01); *H05K 7/20181* (2013.01)

(58) Field of Classification Search
CPC ........... H05K 7/20145; H05K 7/20172; H05K 7/20181; F16K 15/026; F04D 25/14; F04D 29/4226
USPC ....................................................... 454/228
See application file for complete search history.

(56) References Cited

U.S. PATENT DOCUMENTS

| | | | |
|---|---|---|---|
| 3,905,787 A * | 9/1975 | Roth ....................... | B01D 46/10 55/518 |
| 5,261,856 A * | 11/1993 | Walser ............... | B60H 1/00678 454/162 |
| 5,509,445 A * | 4/1996 | Couet ..................... | F24F 13/10 454/359 |
| 5,803,805 A * | 9/1998 | Sells ...................... | E04D 13/174 454/364 |
| 5,890,959 A * | 4/1999 | Pettit .................... | H05K 7/2019 137/849 |
| 6,186,889 B1 * | 2/2001 | Byrne ................ | H05K 7/20172 361/695 |
| 6,556,437 B1 * | 4/2003 | Hardin ............... | H05K 7/20172 361/679.48 |

(Continued)

FOREIGN PATENT DOCUMENTS

| | | | | |
|---|---|---|---|---|
| CN | 107734932 A | * | 2/2018 | ............. H01H 37/36 |
| CN | 119072070 A | * | 12/2024 | ............. H04L 49/10 |

(Continued)

*Primary Examiner* — Steven B Mcallister
*Assistant Examiner* — Frances F. Hamilton
(74) *Attorney, Agent, or Firm* — ScienBiziP, P.C.

(57) ABSTRACT

A fan module includes a mounting bracket, a fan and a one-way shutter are detachably installed in the mounting bracket. The fan module is configured for installation at an electronic device along an insertion direction, the fan is configured to generate airflow along or opposite to the insertion direction, and the one-way shutter allows the airflow to pass through. The fan is configured to generate airflow in an opposite direction by being turned over, and the one-way shutter allows the airflow in the opposite direction to pass through by being turned over correspondingly. The one-way shutter includes a shutter base defining multiple guide holes, a baffle, and multiple float balls in the guide holes for allowing or preventing air to pass through the guide holes to achieve one-way pass function. An electronic device comprising the fan module is also provided.

12 Claims, 10 Drawing Sheets

(56) References Cited

U.S. PATENT DOCUMENTS

| | | | | |
|---|---|---|---|---|
| 6,805,626 | B2 * | 10/2004 | Chen | G06F 1/20 312/236 |
| 7,848,100 | B2 * | 12/2010 | Wayman | H04Q 1/035 312/265.6 |
| 10,306,810 | B1 * | 5/2019 | Pichai | F24F 13/08 |
| 10,326,330 | B2 | 6/2019 | Kursula et al. | |
| 10,779,434 | B2 * | 9/2020 | Chang | H05K 7/20145 |
| 2006/0016482 | A1 * | 1/2006 | Berens | F16K 15/031 137/512.15 |
| 2008/0101019 | A1 * | 5/2008 | Tao | H05K 7/20727 361/695 |
| 2008/0151492 | A1 * | 6/2008 | Maddox | G06F 1/20 361/679.49 |
| 2011/0228477 | A1 * | 9/2011 | Hong | H05K 7/20181 165/96 |
| 2012/0113591 | A1 * | 5/2012 | Chuang | H05K 7/20172 361/695 |
| 2012/0138262 | A1 * | 6/2012 | Zhang | F04D 29/601 165/67 |
| 2013/0017076 | A1 * | 1/2013 | Li | H05K 7/20181 415/201 |
| 2013/0023199 | A1 * | 1/2013 | Li | H05K 7/20181 454/355 |
| 2013/0056090 | A1 * | 3/2013 | Tang | G06F 1/20 137/215 |
| 2013/0155608 | A1 * | 6/2013 | Tang | H05K 7/20727 361/679.48 |
| 2014/0369828 | A1 * | 12/2014 | Wu | F04D 25/0613 415/213.1 |
| 2018/0080571 | A1 * | 3/2018 | Yu | F04D 25/166 |
| 2018/0376614 | A1 * | 12/2018 | Xiong | F04D 25/0613 |
| 2022/0333614 | A1 * | 10/2022 | Chang | F04D 19/007 |
| 2024/0392795 | A1 * | 11/2024 | Yeh | H05K 7/20181 |

FOREIGN PATENT DOCUMENTS

| | | | | |
|---|---|---|---|---|
| EP | 1939456 | B1 * | 3/2014 | F04D 25/12 |
| EP | 3517786 | A1 * | 7/2019 | F04D 19/007 |
| TW | 535856 | U | 6/2003 | |
| TW | 202448265 | A * | 12/2024 | |

* cited by examiner

FAN MODULE AND ELECTRONIC DEVICE

FIELD

The subject matter herein generally relates to heat dissipation devices, and particularly to a fan module structured and arranged for heat dissipation of electrical components and an electronic device including the fan module.

BACKGROUND

Switches typically require two or more fan modules for cooling. There are two types of switches available: heat exhaust switches and cold air intake switches. Different types of switches require fans to blow air in different directions to ensure that the cooling direction of the switch is consistent with other devices. In addition, existing fan modules for switches do not have one-way shutters, which may cause heated air that has already been discharged to be sucked back into the switch through a non-operating fan module, disrupting the cooling of the entire switch. In some special occasions, such as outdoor use, the air may contain dust, oil, or flying insects, and other foreign objects, which if accidentally sucked in by the fan, may also affect the normal operation and cooling of internal components of the switch.

BRIEF DESCRIPTION OF THE DRAWINGS

Implementations of the present technology will now be described, by way of example only, with reference to the attached figures, wherein.

DETAILED DESCRIPTION

Figure 1:
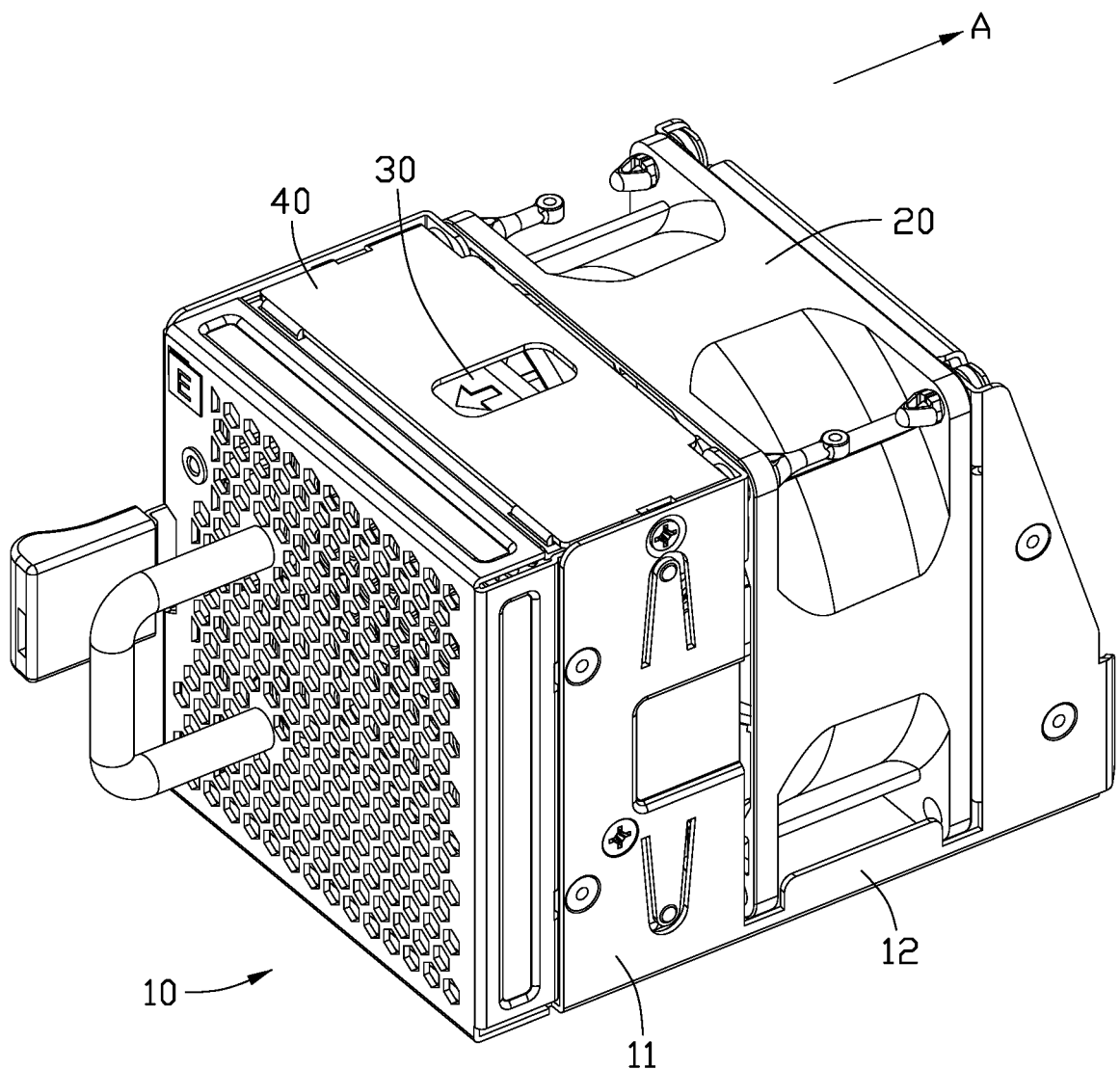
FIG. 1 is a perspective view of a fan module of an embodiment of the disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

Figure 2:
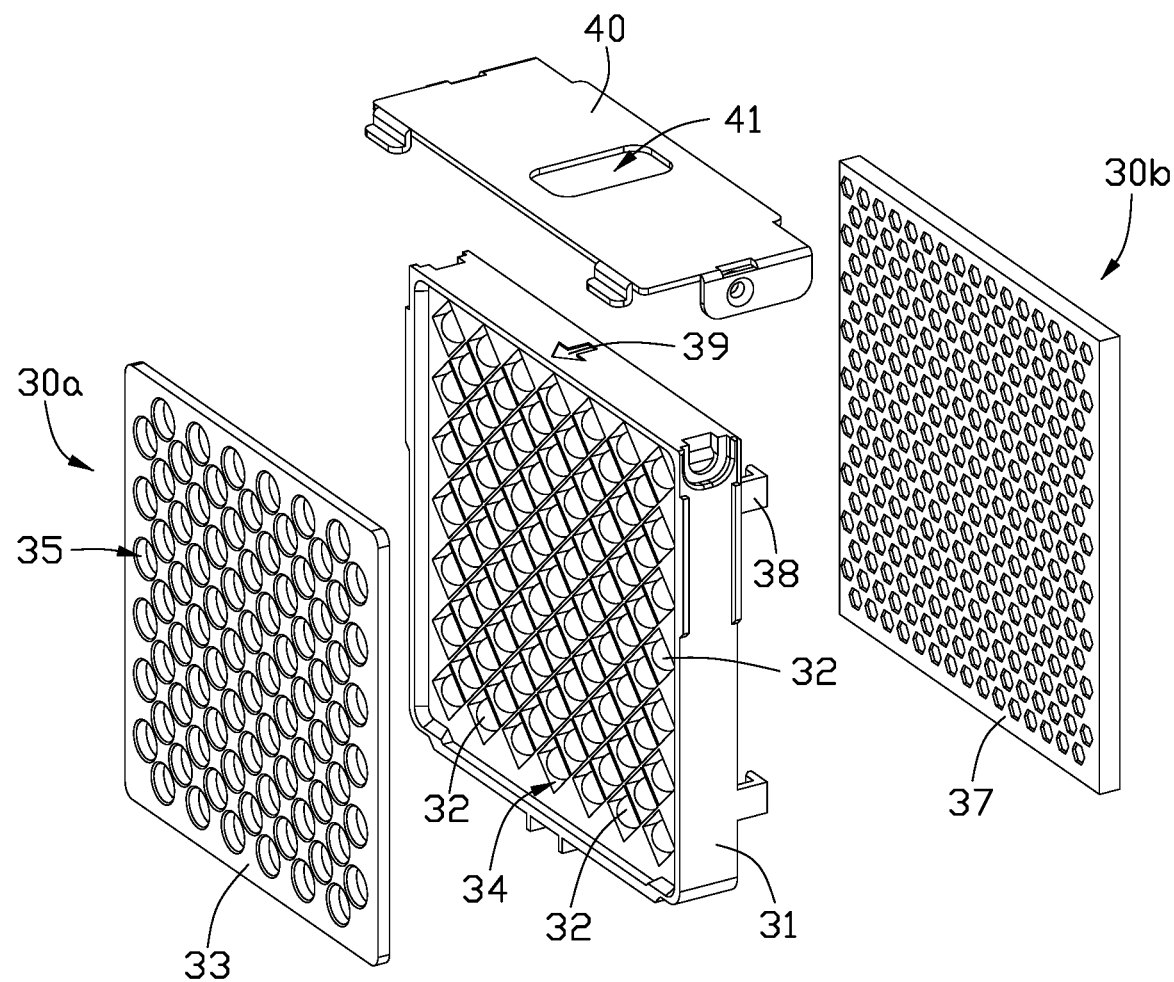
FIG. 2 is an explosive view of a one-way shutter of the fan module in FIG. 1.

As shown in FIG. 1 and FIG. 2, an embodiment provides a fan module 100 for installation at one end of an electronic device (not shown) along an insertion direction A to provide cooling for the electronic device. The fan module 100 includes a mounting bracket 10, a fan 20, and a one-way shutter 30 located within the mounting bracket 10.

The mounting bracket 10 is used to connect to the electronic device, and along the insertion direction A, it sequentially includes a one-way shutter installation area 11 and a fan installation area 12.

The fan 20 is detachably installed in the fan installation area 12 of the mounting bracket. The airflow direction of the fan 20 can be the same as or opposite to the insertion direction A. The one-way shutter 30 is detachably installed in the one-way shutter installation area 11 of the mounting bracket 10. The one-way shutter 30 has an outflow side 30a and an inflow side 30b opposite to the outflow side, allowing airflow to pass through the one-way shutter 30 from the inflow side 30b to the outflow side 30a.

Figure 3:
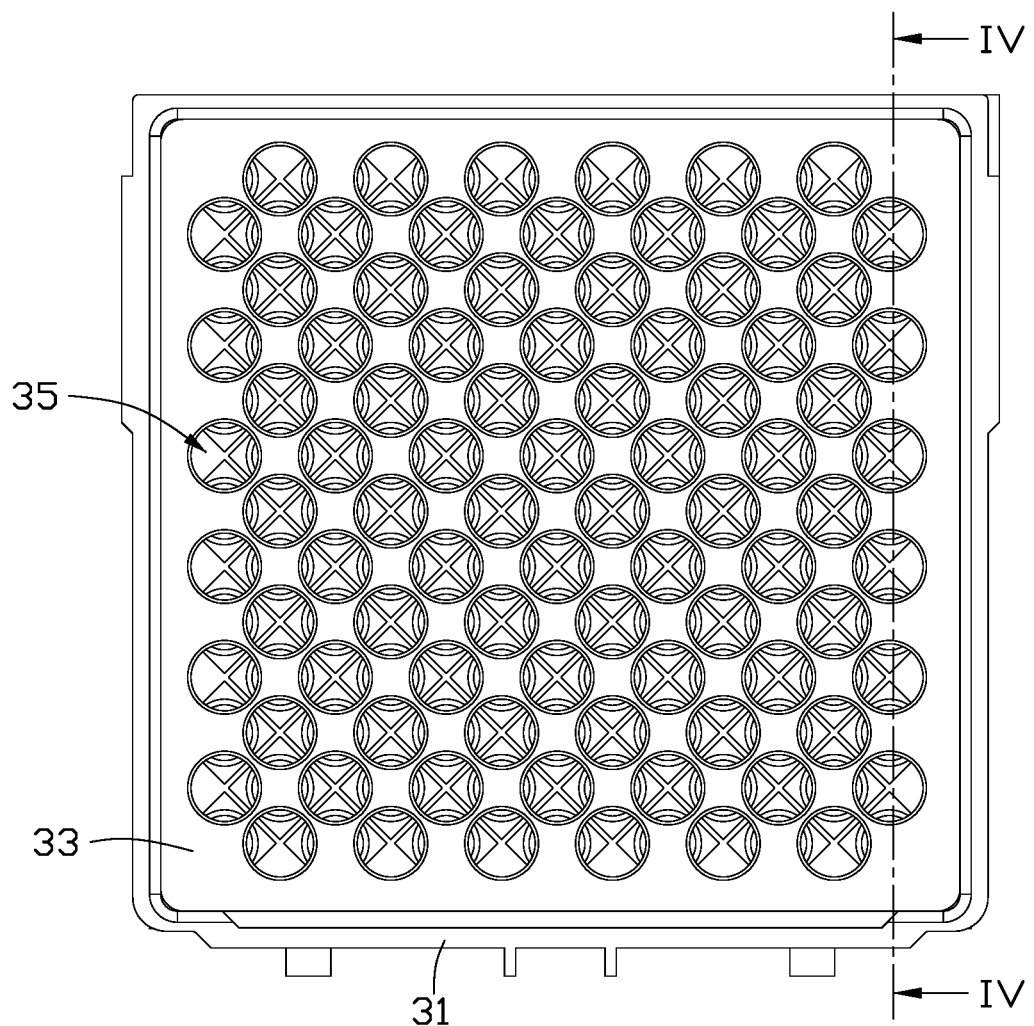
FIG. 3 is a front view of the one-way shutter of the fan module in FIG. 2.
Figure 4:
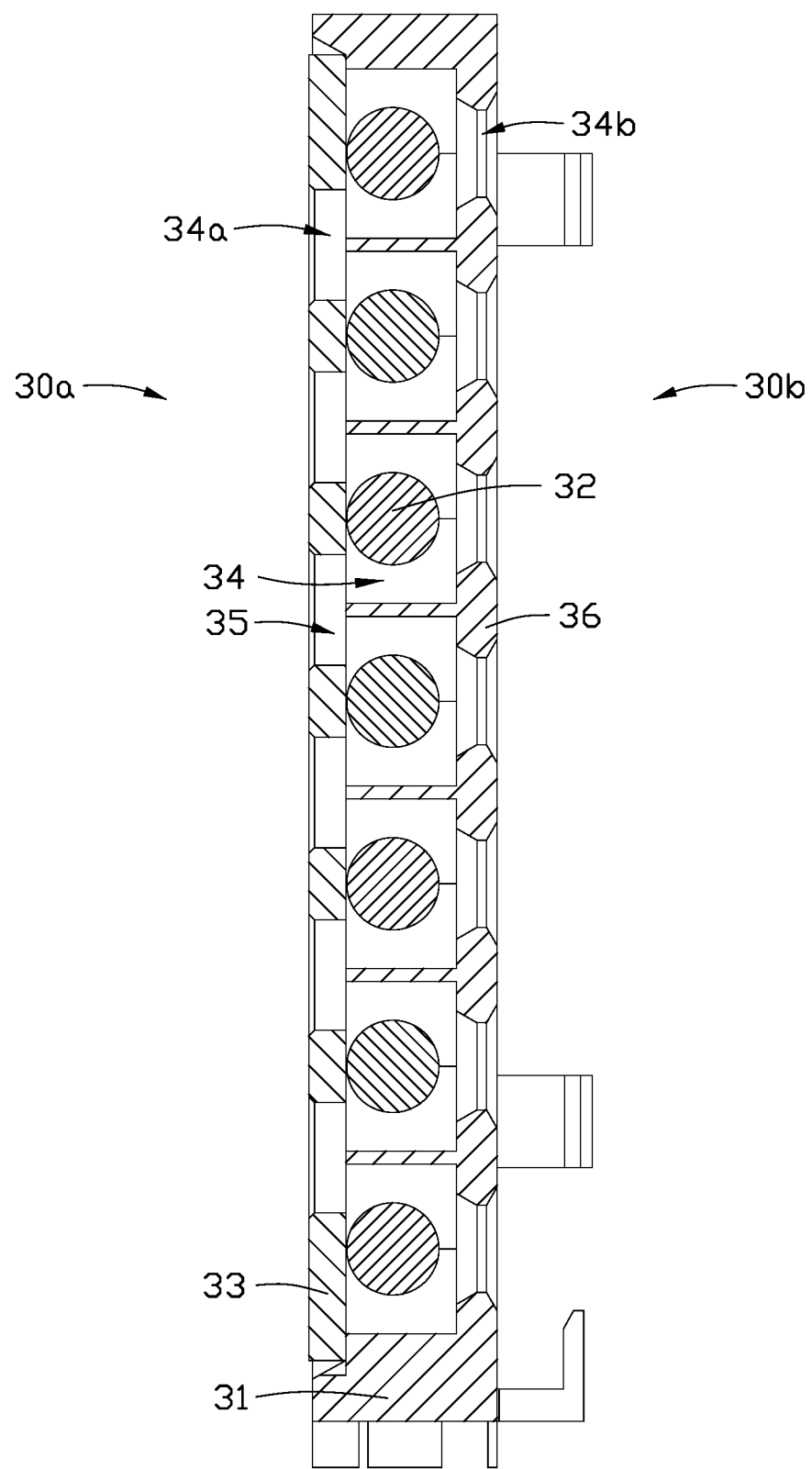
FIG. 4 is a cross section view of the one-way shutter in FIG. 3, taken along a line IV-IV, wherein the one-way shutter is in open state.
Figure 5:
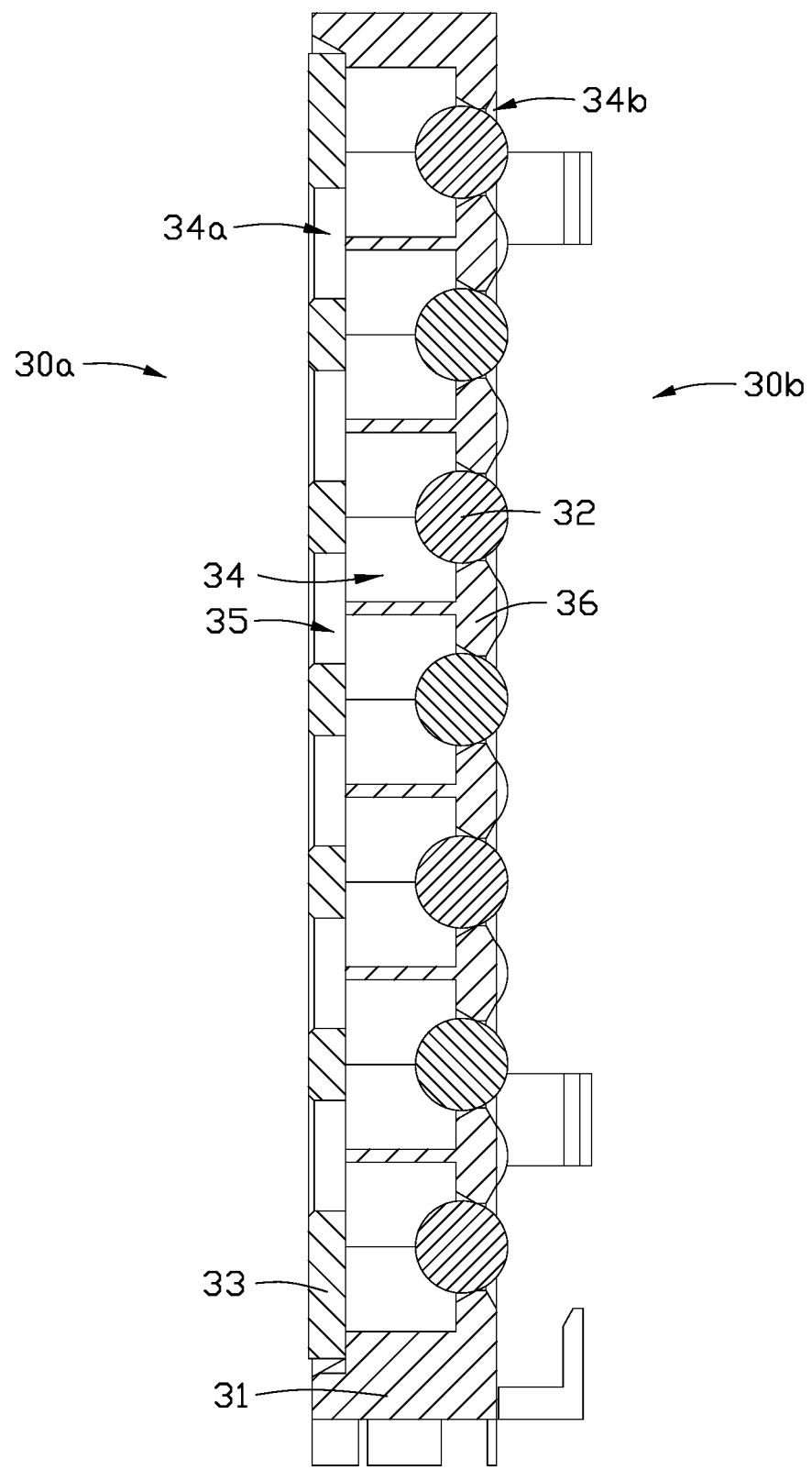
FIG. 5 is a cross section view of the one-way shutter in FIG. 3, taken along a line IV-IV, wherein the one-way shutter is in closed state.

Specifically, the one-way shutter 30 includes a shutter base 31, multiple float balls 32, and a baffle 33, as shown in FIG. 3, FIG. 4, and FIG. 5. The shutter base 31 defines multiple guide holes 34 that penetrate through the shutter base 31. Each guide hole 34 includes an air inlet 34b on the inflow side 30b and an air outlet 34a on the outflow side 30a. The diameter of the air inlet 34b is smaller than the diameter of the air outlet 34a. Each float ball 32 is correspondingly accommodated in one of the multiple guide holes 34, with the diameter of the float ball 32 being larger than the diameter of the air inlet 34b and smaller than the diameter of the air outlet 34a. The baffle 33 is positioned on a side of the shutter base 31 near the outflow side 30a and has multiple through-holes 35. Each through-hole 35 aligns with wall between adjacent guide holes 34 on the shutter base 31.

As shown in FIG. 4, when airflow enters the one-way shutter 30 from the inflow side 30b, the float ball 32 is blown by the airflow toward the air outlet 34a and comes into contact with the baffle 33, forming an airflow channel between inner wall of the guide hole 34 and the float ball 32 to allow airflow to pass through. As shown in FIG. 5, when airflow enters the one-way shutter 30 from the outflow side 30a, the float ball 32 is blown by the airflow toward the air inlet 34b, blocking the air inlet 34b and closing the airflow channel.

Therefore, when the fan 20 stops working, the float ball 32 is positioned within the guide hole 34. When there is airflow entering the one-way shutter 30 from the outflow side 30a, the float ball 32 is blown towards the air inlet 34b by the airflow. Since the diameter of the float ball 32 is larger than the diameter of the air inlet 34b, the float ball 32 blocks the air inlet 34b, preventing the airflow from passing through. The function of avoiding the airflow passing through the one-way shutter 30 from the outflow side 30a can be achieved.

During use, the one-way shutter 30 can prevent the backflow of expelled hot air when the fan module 100 malfunctions and stops working. For example, in a situation where multiple fan modules 100 are installed on a hot exhaust-type switch, all fan modules 100 face the same direction and used to exhaust the hot air from the switch, if some fan modules 100 malfunction and their fans stop working, the expelled hot air may be sucked back in through the stopped fan module 100, blowing the float ball 32 of the one-way shutter 30 toward the air inlet 34b of the guide hole 34 and blocking it, thereby closing the airflow channel and avoiding interference with the overall heat dissipation. Alternatively, the one-way shutter 30 can also prevent the premature discharge of normally blown cold air from the malfunctioning fan module 100 before it enters the switch. For example, in a situation where multiple fan modules 100 are installed on a cold air intake-type switch, all facing the same direction and used to blow cold air into the switch, if some fan modules 100 malfunction and their fans stop working, the cold air blown in by the functioning fan modules 100 may directly flow out from the malfunctioning fan module, blowing the float ball 32 of the one-way shutter 30 toward the air inlet 34b of the guide hole 34 and blocking it, thereby closing the airflow channel and preventing the airflow from being discharged without effectively passing through heat-generating components inside the switch, resulting in a recirculation phenomenon.

In other embodiments, as shown in FIG. 4 and FIG. 5, each guide hole 34 is equipped with a flange 36 protruding from the inner wall of the guide hole 34 on the inflow side 30b. The flange 36 forms the air inlet 34b.

In other embodiments, top of the flange 36 is concavely curved inward in an arc shape for fitting the float ball 32.

Therefore, when the float ball 32 blocks the air inlet 34b, it can fit better with the flange 36, thereby improving the blocking effect.

Figure 6:
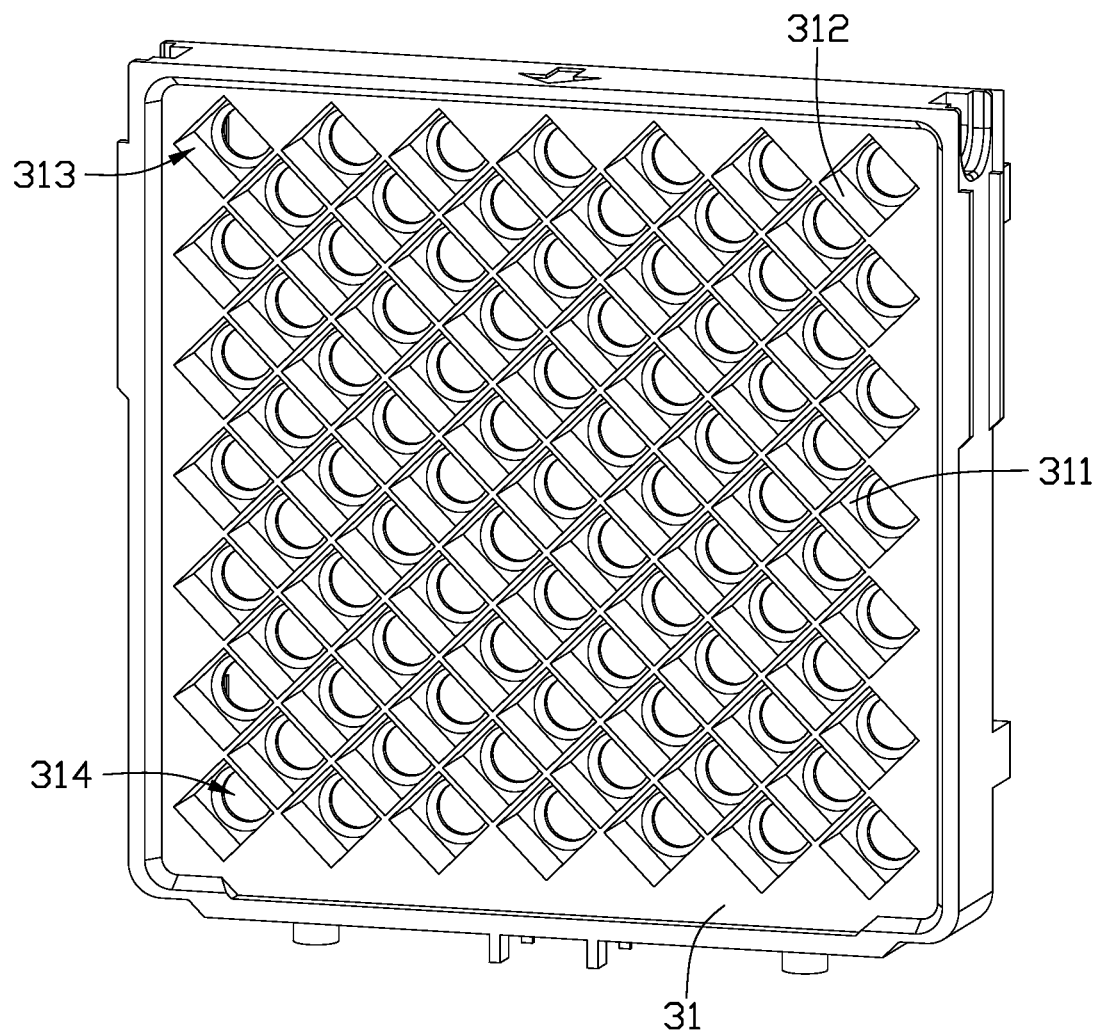
FIG. 6 is a perspective view of a shutter base of the one-way shutter in FIG. 2.

In other embodiments, as shown in FIG. 5 and FIG. 6, the shutter base 31 includes a substrate 311 and side walls 312 that are perpendicular to the substrate 311. The side walls 312 form multiple grilles 313. In this embodiment, each grille 313 defines a guide hole 34. The substrate 311 defines multiple openings 314 corresponds to the grilles 313. In this embodiment, each opening 314 acts as the air inlet 34b of the guide hole 34. Each opening 314 on the baffle plate 33 is aligned with an intersection of the side walls 312 on the shutter base 31.

Figure 7:
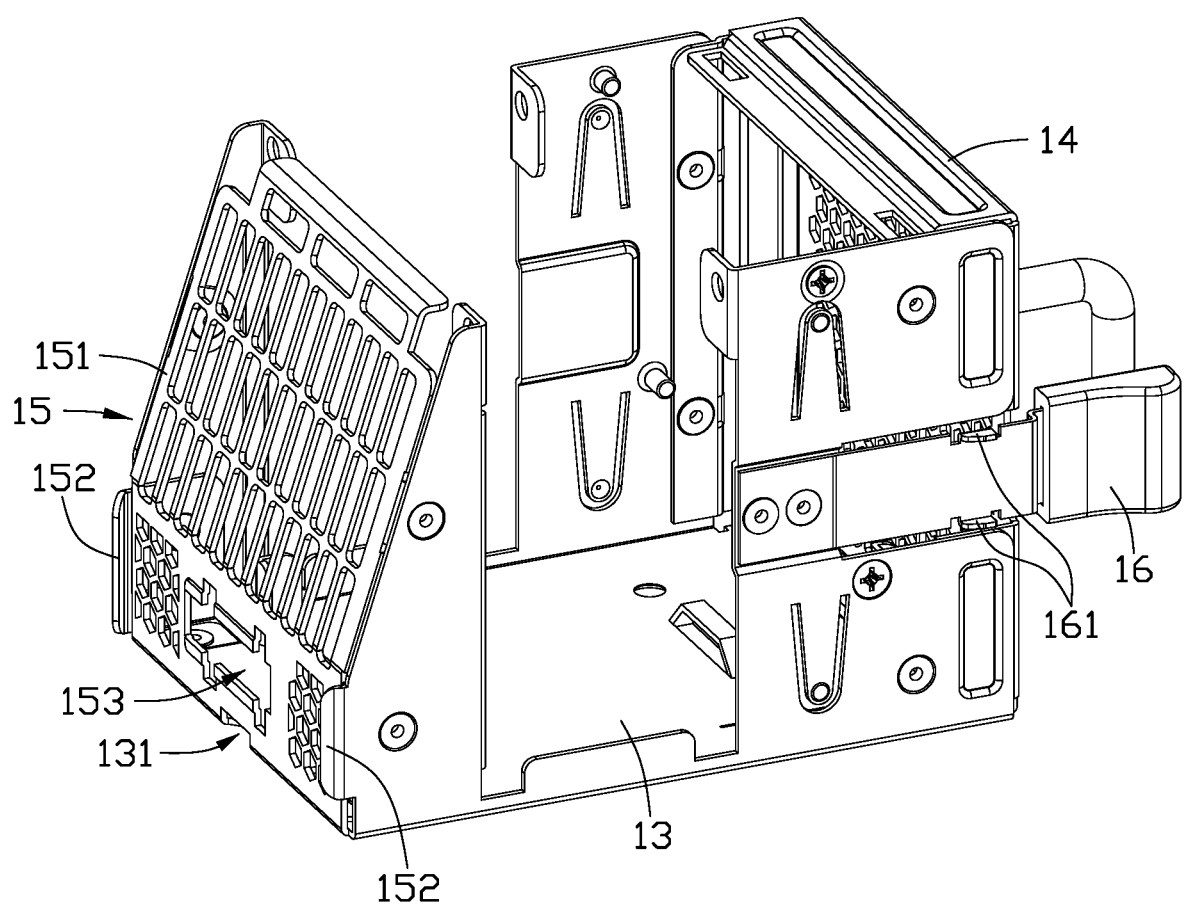
FIG. 7 is a perspective view of a mounting bracket of the fan module in FIG. 1.
Figure 8:
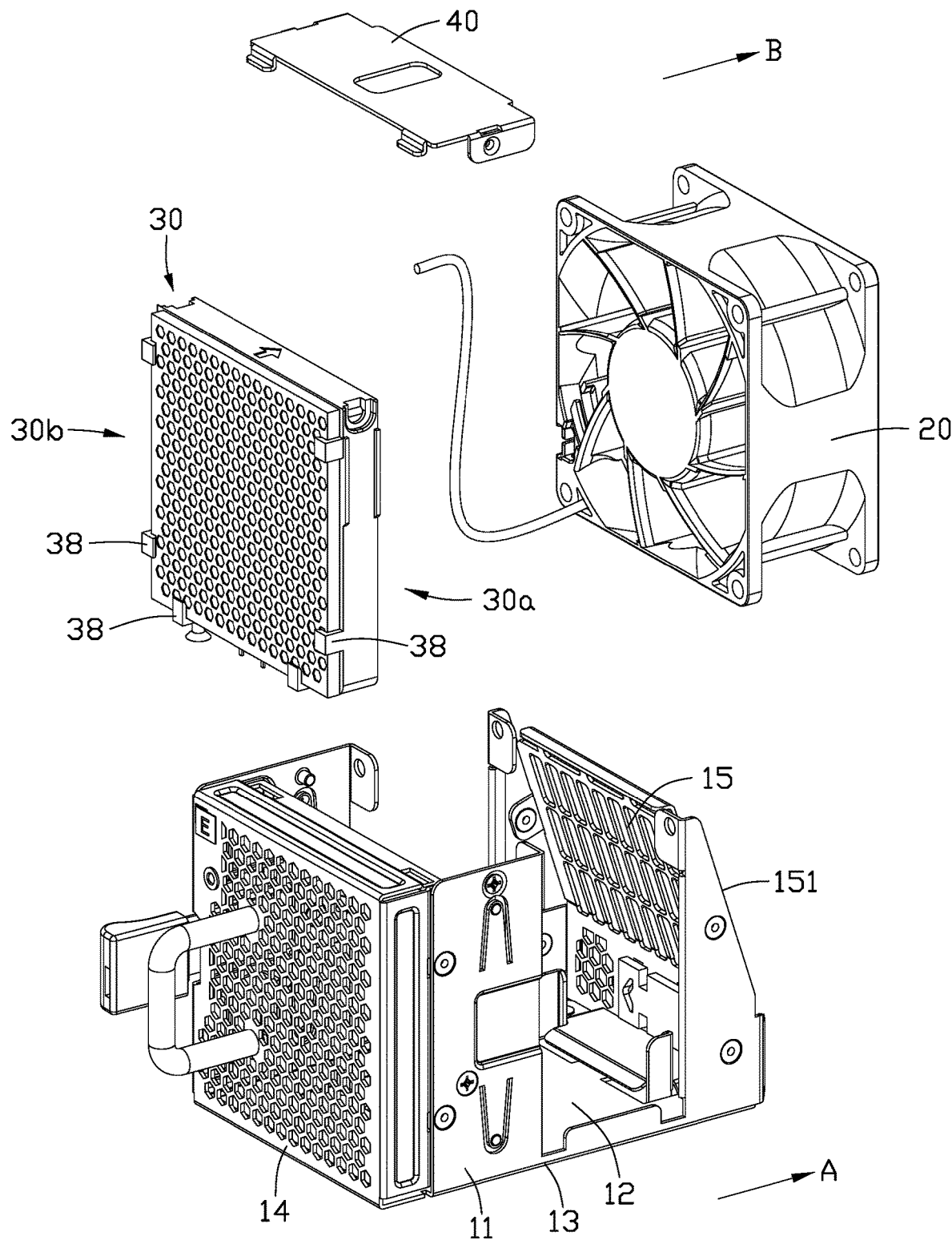
FIG. 8 is a perspective view of assembly of the fan module in FIG. 1 when the fan module generates air flow along an insertion direction.
Figure 9:
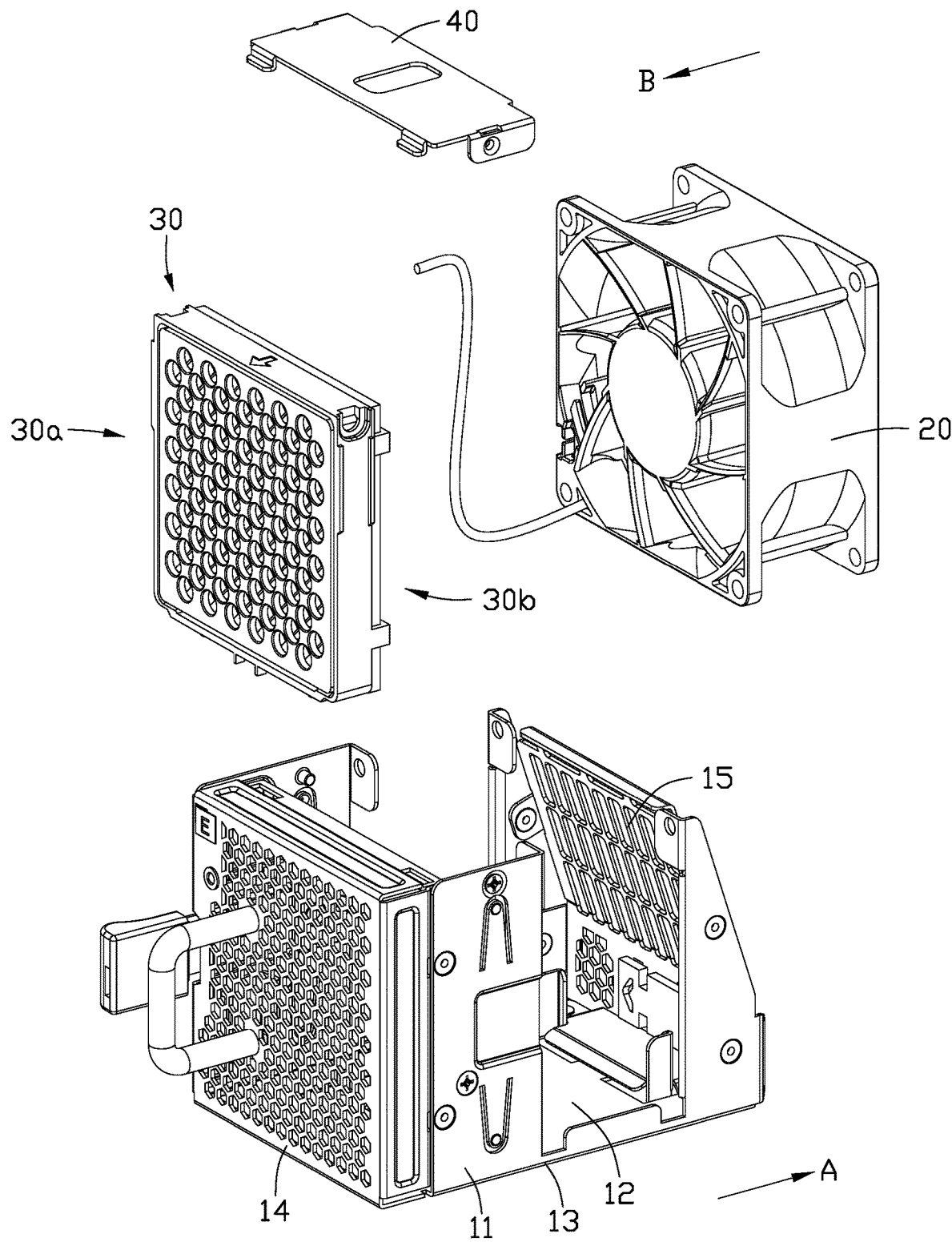
FIG. 9 is a perspective view of assembly of the fan module in FIG. 1 when the fan module generates air flow opposite to the insertion direction.

In other embodiments, as shown in FIG. 7 and FIG. 8, the mounting bracket 10 includes a base 13, where the one-way shutter installation area 11 and the fan installation area 12 are located on the base 13. The mounting bracket 10 further includes an outer wall 14 positioned away from the fan installation area 12 and an inner wall 15 positioned away from the one-way shutter installation area 11. The outer wall 14 and the inner wall 15 are connected to the base 13. The inner wall 15 has a guiding slope 151, forming an acute angle (not labeled) with the base 13. The inner wall 15 also has two guide plates 152, each positioned at the opposite ends of the inner wall 15 and inclined towards each other. On the side of the base 13 opposite to the fan 20, there is a guiding groove 131 located near one end of the inner wall 15 and extending towards the outer wall 14. The guiding slope 151, guide plates 152, and guiding groove 131 are used to guide the fan module 100 to be inserted into position when it is mounted in the electronic device.

During use, the fan module 100 is installed in an electronic device such as a switch for heat dissipation. The fan module 100 is inserted into the switch with the outer wall 14 facing outward and the inner wall 15 facing inward. The guiding slope 151, guide plates 152, and guiding groove 131 are utilized to guide a proper installation of the fan module 100 into position during this process.

In other embodiments, the inner wall 15 is equipped with a terminal slot 153, which is used to accommodate a wiring terminal of the fan 20. This allows the wiring terminals of the fan 20 to be connected to the electronic device when the fan module 100 is installed.

In other embodiments, the mounting bracket 10 has a locking member 16 near the outer wall 14. The locking member 16 is elastically connected to the mounting bracket 10 and has a locking portion 161. The locking portion 161 is used to secure the fan module 100 in place after installation.

During the installation of the fan module 100 into the electronic device, the locking portion 161 is subjected to pressure from the electronic device, causing the locking member 16 to deform and tilt towards the mounting bracket 10. After the fan module 100 is installed in place, the locking member 16 restores and the locking portion 161 can securely engage with the electronic device under the restoring force of the locking member 16, thereby effectively fixing the fan module 100 in place.

When using the fan module 100 provided in this disclosure, a desired airflow direction needs to be determined based on installation environment of the fan module 100. For example, if the fan module 100 needs to be installed in a cold air intake switch to provide external cold air for heat dissipation from the outer wall 14 to the inner wall 15, referring to FIG. 1 and FIG. 8, the fan 20 is installed with an airflow direction B same as the insertion direction A, the one-way shutter 30 is installed directly facing the fan 20 on the outflow side 30a, allowing the airflow to pass through the one-way shutter 30 and the fan 20, and enter the cold air intake switch to supply external cold air for heat dissipation. This configuration allows the airflow to pass through the one-way shutter 30 and the fan 20 sequentially.

Alternatively, if the fan module 100 needs to be installed in a hot air exhaust switch to expel the generated heat from the inner wall 15 to the outer wall 14, the fan 20 is installed with the airflow direction B opposite to the insertion direction A. the one-way shutter 30 is installed directly facing the fan 20 on the inflow side 30b, allowing the airflow to pass through the fan 20 and the one-way shutter 30, effectively exhausting the hot air from the hot air exhaust switch. This configuration allows the airflow to pass through the fan 20 and the one-way shutter 30 sequentially.

Further, in either situation, when the fan 20 is turned off and airflow whose direction differs from the permitted airflow direction of the one-way shutter 30 passes, the float ball 32 blocks the air inlet 34b of the guiding hole 34 due to the pressure difference on both sides of the fan module 100. This effectively closes the airflow channel and prevents interference from airflow in different directions.

In this embodiment, the airflow direction B of the fan 20 can be switched between being the same as or opposite to the insertion direction A by detaching the fan 20 from the mounting bracket 10, turning the fan 20 by 180° and reinstalling it onto the mounting bracket 10. Similarly, the one-way shutter 30 can be switched between facing the fan 20 on the outflow side 30a and facing the fan 20 on the inflow side 30b by removing it from the mounting bracket 10, turning it by 180°, and reinstalling it onto the mounting bracket 10. It should be understood that in this embodiment, the fan 20 can only generate airflow in a single direction, and flipping the fan 20 is necessary to switch the direction of the airflow it produces. In other embodiments, it is also possible to use fans with switchable airflow directions, eliminating the need to adjust the orientation of the fan to change the airflow direction it produces, and the one-way shutter 30 can be switched can be switched according to the airflow direction of the fan.

In other embodiments, as shown in FIG. 2, the one-way shutter 30 also includes a filter 37 removable mounted on the shutter base 31 and located at the inflow side 30b of the shutter base 31. This allows the filter 37 to prevent the fan module 100, when used as a cold air intake for a switch, from sucking in dust, debris, and other impurities along with the cold air.

In other embodiments, the shutter base 31 is equipped with multiple brackets 38. The filter 37 is mounted on the shutter base 31 through inserting into the brackets 38 for easy replacement. In this embodiment, the brackets 38 can be with an L-shaped structure. It should be understood that the brackets 38 can also be other shapes or structures, such as U-shaped or snap-on structures with snap function, as long as they are easy to attach the filter 37 and allow for easy removable connection of the filter 37.

In this embodiment, as shown in FIG. 8, the shutter base 31 is equipped with six brackets 38, which are placed on three edges of the shutter base 31 to collectively secure the filter 37. In this way, when replacing the filter 37, it is only necessary to remove the filter 37 from the side of the shutter base 31 where the brackets 38 are not installed and then insert a new filter 37.

In other embodiments, the mounting bracket 32 is equipped with markers 39 for indicating direction of the airflow generated by the fan 20, so that the user can confirm the state of the fan 20 or the one-way shutter 30 without having to remove them when installing the fan module 100 on electronic devices such as switches.

In other embodiments, the one-way shutter 30 further includes a top cover 40. The top cover 40 is placed on the shutter 31 and is set opposite to the base 11. The top cover 40 is provided with a window 41 at a position corresponding to the marker 39.

Figure 10:
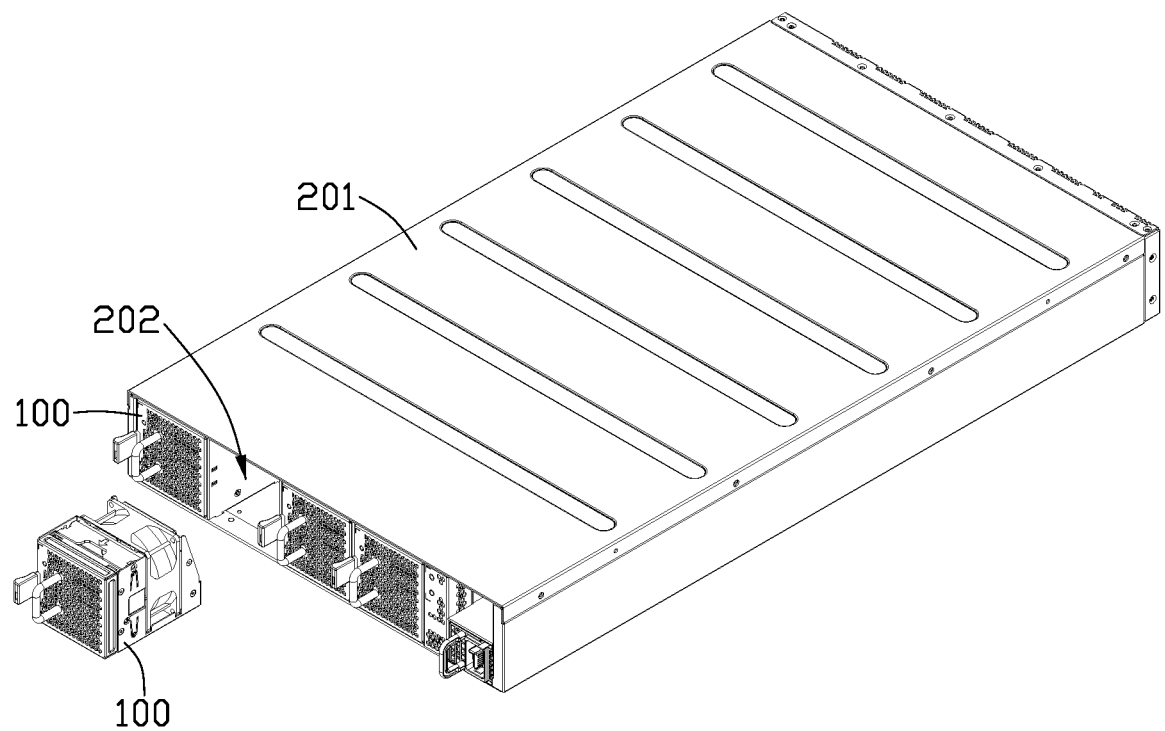
FIG. 10 is a perspective view of an electronic device of an embodiment of the disclosure.

Referring to FIG. 10, an electronic device 200 of an embodiment of the disclosure is provided. The electronic device 200 includes a casing 201 and a plurality of fan modules 100 above-mentioned. The casing 201 defines a plurality of vents 202, and the plurality of fan modules 100 are assembled in the vents 202.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A fan module for installation at one end of an electronic device along an insertion direction to provide cooling for the electronic device, comprising:
 a mounting bracket configured for connecting to the electronic device, the mounting bracket sequentially comprises a one-way shutter installation area and a fan installation area;
 a fan detachably installed in the fan installation area of the mounting bracket, the fan is configured for generating an airflow along a direction same as or opposite to the insertion direction; and
 a one-way shutter detachably installed in the one-way shutter installation area of the mounting bracket, wherein the one-way shutter comprises an outflow side and an inflow side opposite to the outflow side, allowing airflow to pass through the one-way shutter from the inflow side to the outflow side, the one-way shutter comprises:
  a shutter base defining multiple guide holes that penetrate through the shutter base, each of the guide holes comprises an air inlet on the inflow side and an air outlet on the outflow side, a diameter of the air inlet is smaller than a diameter of the air outlet;
  multiple float balls accommodated in the multiple guide holes; and
  a baffle positioned on a side of the shutter base near the outflow side, the baffle defines multiple through-holes for ventilation, each of the through-holes aligns with a partition between adjacent guide holes on the shutter base; wherein
 when airflow enters the one-way shutter from the inflow side, the float ball is blown by the airflow toward the air outlet and comes into contact with the baffle, forming an airflow channel between a wall of the guide hole and the float ball to allow the airflow to pass through; and
 when airflow enters the one-way shutter from the outflow side, the float ball is blown by the airflow toward the air inlet, blocking the air inlet and closing the airflow channel;
 wherein the mounting bracket comprises a base, and the one-way shutter installation area and the fan installation area are located on the base;
 the mounting bracket further comprises an outer wall positioned away from the fan installation area and an inner wall positioned away from the one-way shutter installation area, the outer wall and the inner wall are connected to the base;
 the inner wall comprises a guiding slope forming an acute angle with the base;
 two guiding plates are provided on the inner wall, which are respectively set at two opposite ends of the inner wall and inclined towards each other;
 a guiding groove is defined on a side of the base away from the fan, the guiding groove is located at an end of the base near the inner wall and extends towards the outer wall;
 the guiding slope, the guiding plates, and the guiding groove are configured for guiding the fan module to be inserted in position;
 wherein the inner wall of the mounting bracket defines a terminal slot for accommodating a wiring terminal of the fan;
 wherein the mounting bracket is provided with a locking member near the outer wall;

the locking member is elastically connected to the mounting bracket and has a locking portion for securing the fan module after the fan module is installed in place.

2. The fan module of claim 1, wherein each of the guide holes is equipped with a flange protruding from the wall of the guide hole on the inflow side, and the flange forms the air inlet.

3. The fan module of claim 2, wherein top of the flange is concavely curved inward in an arc shape for fitting the float ball.

4. The fan module of claim 1, wherein the shutter base comprises a substrate and side walls perpendicular to the substrate, the side walls form multiple grilles, each of the grilles defines one of the guide holes;
the substrate defines multiple openings corresponding to the multiple grilles, each of the openings acts as the air inlet of the guide hole, and each of the openings on the baffle plate is aligned with an intersection of the side walls on the shutter base.

5. The fan module of claim 1, wherein the one-way shutter comprises a filter removable mounted on the shutter base, the filter is located at the inflow side of the shutter base.

6. The fan module of claim 5, wherein the shutter base is equipped with multiple brackets, the filter is mounted on the shutter base through inserting into the brackets.

7. An electronic device, comprising:
a casing defining a plurality of vents; and
a plurality of fan modules assembled in the plurality of vents, each of the plurality of fan modules comprising:
a mounting bracket configured for connecting to the electronic device, the mounting bracket sequentially comprises a one-way shutter installation area and a fan installation area;
a fan detachably installed in the fan installation area of the mounting bracket, the fan is configured for generating an airflow along a direction same as or opposite to the insertion direction, and
a one-way shutter detachably installed in the one-way shutter installation area of the mounting bracket, wherein the one-way shutter comprises an outflow side and an inflow side opposite to the outflow side, allowing airflow to pass through the one-way shutter from the inflow side to the outflow side, the one-way shutter comprises:
a shutter base defining multiple guide holes that penetrate through the shutter base, each of the guide holes comprises an air inlet on the inflow side and an air outlet on the outflow side, a diameter of the air inlet is smaller than a diameter of the air outlet;
multiple float balls accommodated in the multiple guide holes; and
a baffle positioned on a side of the shutter base near the outflow side, the baffle defines multiple throughholes for ventilation, each of the through-holes aligns with a partition between adjacent guide holes on the shutter base; wherein
when airflow enters the one-way shutter from the inflow side, the float ball is blown by the airflow toward the air outlet and comes into contact with the baffle, forming an airflow channel between a wall of the guide hole and the float ball to allow the airflow to pass through; and
when airflow enters the one-way shutter from the outflow side, the float ball is blown by the airflow toward the air inlet, blocking the air inlet and closing the airflow channel,
wherein the mounting bracket comprises a base, and the one-way shutter installation area and the fan installation area are located on the base;
the mounting bracket further comprises an outer wall positioned away from the fan installation area and an inner wall positioned away from the one-way shutter installation area, the outer wall and the inner wall are connected to the base;
the inner wall comprises a guiding slope forming an acute angle with the base;
two guiding plates are provided on the inner wall, which are respectively set at two opposite ends of the inner wall and inclined towards each other;
a guiding groove is defined on a side of the base away from the fan, the guiding groove is located at an end of the base near the inner wall and extends towards the outer wall;
the guiding slope, the guiding plates, and the guiding groove are configured for guiding the fan module to be inserted in position;
wherein the inner wall of the mounting bracket defines a terminal slot for accommodating a wiring terminal of the fan,
wherein the mounting bracket is provided with a locking member near the outer wall;
the locking member is elastically connected to the mounting bracket and has a locking portion for securing the fan module after the fan module is installed in place.

8. The electronic device of claim 7, wherein each of the guide holes is equipped with a flange protruding from the wall of the guide hole on the inflow side, and the flange forms the air inlet.

9. The electronic device of claim 8, wherein top of the flange is concavely curved inward in an arc shape for fitting the float ball.

10. The electronic device of claim 7, wherein the shutter base comprises a substrate and side walls perpendicular to the substrate, the side walls form multiple grilles, each of the grilles defines one of the guide holes;
the substrate defines multiple openings at corresponding to the multiple grilles, each of the openings acts as the air inlet of the guide hole, and each of the openings on the baffle plate is aligned with an intersection of the side walls on the shutter base.

11. The electronic device of claim 7, wherein the one-way shutter comprises a filter removable mounted on the shutter base, the filter is located at the inflow side of the shutter base.

12. The electronic device of claim 11, wherein the shutter base is equipped with multiple brackets, the filter is mounted on the shutter base through inserting into the brackets.

* * * * *